(12) United States Patent
Gill

(10) Patent No.: US 7,242,556 B2
(45) Date of Patent: Jul. 10, 2007

(54) CPP DIFFERENTIAL GMR SENSOR HAVING ANTIPARALLEL STABILIZED FREE LAYERS FOR PERPENDICULAR RECORDING

(75) Inventor: Hardayal Singh Gill, Palo Alto, CA (US)

(73) Assignee: Hitachi Global Storage Technologies Netherlands B.V., Amsterdam (NL)

(*) Notice: Subject to any disclaimer, the term of this patent is extended or adjusted under 35 U.S.C. 154(b) by 394 days.

(21) Appl. No.: 10/874,066

(22) Filed: Jun. 21, 2004

(65) Prior Publication Data
US 2005/0280957 A1 Dec. 22, 2005

(51) Int. Cl.
*G11B 5/33* (2006.01)
*G11B 5/127* (2006.01)

(52) U.S. Cl. .................................. 360/324.12
(58) Field of Classification Search .......... 360/324.11, 360/324.12
See application file for complete search history.

(56) References Cited

U.S. PATENT DOCUMENTS

| | | | |
|---|---|---|---|
| 5,408,377 A * | 4/1995 | Gurney et al. ............... | 360/325 |
| 5,668,688 A | 9/1997 | Dykes et al. ................. | 360/113 |
| 5,701,222 A | 12/1997 | Gill et al. .................... | 360/113 |
| 5,751,521 A | 5/1998 | Gill ............................. | 360/113 |
| 6,185,079 B1 | 2/2001 | Gill ............................. | 360/324.2 |
| 6,219,211 B1 * | 4/2001 | Gill ............................. | 360/324.11 |
| 6,259,586 B1 | 7/2001 | Gill ............................. | 360/324.2 |
| 6,275,363 B1 | 8/2001 | Gill ............................. | 360/324.2 |
| 6,466,419 B1 * | 10/2002 | Mao ............................ | 360/324.12 |
| 6,473,279 B2 | 10/2002 | Smith et al. ................ | 360/324.12 |
| 6,611,405 B1 | 8/2003 | Inomata et al. ............ | 360/324.2 |
| 6,643,103 B1 | 11/2003 | Trindade ..................... | 360/314 |
| 6,643,915 B2 | 11/2003 | Gill ............................. | 29/603.14 |
| 6,657,823 B2 | 12/2003 | Kawato ....................... | 360/314 |
| 6,680,827 B2 | 1/2004 | Li et al. ...................... | 360/314 |
| 6,704,175 B2 | 3/2004 | Li et al. ...................... | 360/324.11 |
| 6,826,022 B2 * | 11/2004 | Umetsu ....................... | 360/324.12 |
| 6,947,263 B2 * | 9/2005 | Saito ........................... | 360/324.12 |
| 2001/0040779 A1 * | 11/2001 | Pinarbasi .................... | 360/324.11 |
| 2003/0123198 A1 | 7/2003 | Sugawara et al. .......... | 360/314 |
| 2003/0143431 A1 | 7/2003 | Hasegawa ................... | 428/692 |
| 2003/0179514 A1 | 9/2003 | Pinarbasi .................... | 360/324.11 |
| 2003/0184918 A1 | 10/2003 | Lin et al. .................... | 360/314 |
| 2003/0197987 A1 * | 10/2003 | Saito ........................... | 360/324.12 |
| 2003/0235016 A1 | 12/2003 | Gill ............................. | 360/324.12 |
| 2004/0008454 A1 | 1/2004 | Gill ............................. | 360/324.12 |

* cited by examiner

Primary Examiner—Brian E. Miller
(74) Attorney, Agent, or Firm—Zilka-Kotab, PC

(57) ABSTRACT

A current perpendicular to plane (CPP) differential giant magnetoresistive (GMR) sensor that is insensitive to stray longitudinal and transverse magnetic fields. The sensor includes an in stack bias layer structure that is used to bias the magnetic moment of first and second free layers disposed at either side thereof. The bias structure includes an antiferromagnetic layer (AFM). An odd number of antiparallel (AP) coupled magnetic layers are formed on a first side of the AFM and an even number of AP coupled magnetic layers on the opposite side of the AFM.

29 Claims, 4 Drawing Sheets

CPP DIFFERENTIAL GMR SENSOR HAVING ANTIPARALLEL STABILIZED FREE LAYERS FOR PERPENDICULAR RECORDING

FIELD OF THE INVENTION

The present invention relates to current perpendicular to plane (CPP) giant magnetoresistive (GMR) sensors and more particularly to a CPP GMR sensor having a free layers stabilized by antiferromagnetic coupling.

BACKGROUND OF THE INVENTION

The heart of a computer is an assembly that is referred to as a magnetic disk drive. The magnetic disk drive includes a rotating magnetic disk, write and read heads that are suspended by a suspension arm adjacent to a surface of a rotating magnetic disk and an actuator that swings the suspension arm to place the read and write heads over selected circular tracks on the rotating disk. The read and write heads are directly located on a slider that has an air bearing surface (ABS). The suspension arm biases the slider into contact with the surface of the disk when the disk is not rotating but, when the disk rotates, air is swirled by the rotating disk. When the slider rides on the air bearing, the write and read heads are employed for writing magnetic impressions to and reading magnetic impressions from the rotating disk. The read and write heads are connected to processing circuitry that operates according to a computer program to implement the writing and reading functions.

The write head includes a coil layer embedded in first, second and third insulation layers (insulation stack), the insulation stack being sandwiched between first and second pole piece layers. A gap is formed between the first and second pole piece layers by a gap layer at an air bearing surface (ABS) of the write head and the pole piece layers are connected at a back gap. Current conducted to the coil layer induces a magnetic flux in the pole pieces which causes a magnetic field to fringe out at a write gap at the ABS for the purpose of writing the aforementioned magnetic impressions in tracks on the moving media, such as in circular tracks on the aforementioned rotating disk.

In recent read head designs a spin valve sensor, also referred to as a giant magnetoresistive (GMR) sensor, has been employed for sensing magnetic fields from the rotating magnetic disk. The sensor includes a nonmagnetic conductive layer, hereinafter referred to as a spacer layer, sandwiched between first and second ferromagnetic layers, hereinafter referred to as a pinned layer and a free layer. First and second leads are connected to the spin valve sensor for conducting a sense current therethrough. The magnetization of the pinned layer is pinned perpendicular to the air bearing surface (ABS) and the magnetic moment of the free layer is located parallel to the ABS, but free to rotate in response to external magnetic fields. The magnetization of the pinned layer is typically pinned by exchange coupling with an antiferromagnetic layer.

The thickness of the spacer layer is chosen to be less than the mean free path of conduction electrons through the sensor. With this arrangement, a portion of the conduction electrons is scattered by the interfaces of the spacer layer with each of the pinned and free layers. When the magnetizations of the pinned and free layers are parallel with respect to one another, scattering is minimal and when the magnetizations of the pinned and free layer are antiparallel, scattering is maximized. Changes in scattering alter the resistance of the spin valve sensor in proportion to cos Θ, where Θ is the angle between the magnetizations of the pinned and free layers. In a read mode the resistance of the spin valve sensor changes proportionally to the magnitudes of the magnetic fields from the rotating disk. When a sense current is conducted through the spin valve sensor, resistance changes cause potential changes that are detected and processed as playback signals.

A spin valve sensor is characterized by a magnetoresistive (MR) coefficient that is substantially higher than the MR coefficient of an anisotropic magnetoresistive (AMR) sensor. For this reason a spin valve sensor is sometimes referred to as a giant magnetoresistive (GMR) sensor. When a spin valve sensor employs a single pinned layer it is referred to as a simple spin valve. When a spin valve employs an antiparallel (AP) pinned layer it is referred to as an AP pinned spin valve. A pinned layer in an AP pinned spin valve includes first and second magnetic layers separated by a thin non-magnetic coupling layer such as Ru. The thickness of the spacer layer is chosen so as to antiparallel couple the magnetizations of the ferromagnetic layers of the pinned layer. A spin valve is also known as a top or bottom spin valve depending upon whether the pinning layer is at the top (formed after the free layer) or at the bottom (before the free layer).

The spin valve sensor is located between first and second non-magnetic electrically insulating read gap layers and the first and second read gap layers are located between ferromagnetic first and second shield layers. In a merged magnetic head a single ferromagnetic layer functions as the second shield layer of the read head and as the first pole piece layer of the write head. In a piggyback head the second shield layer and the first pole piece layer are separate layers.

Sensors can also be categorized as current in plane (CIP) sensors or as current perpendicular to plane (CPP) sensors. In a CIP sensor, current flows from one side of the sensor to the other side parallel to the planes of the materials making up the sensor. Conversely, in a CPP sensor the sense current flows from the top of the sensor to the bottom of the sensor perpendicular to the plane of the layers of material making up the sensor. In a CPP sensor design, the magnetic shields usually double as electrical leads for supplying a sense current to the sensor. Therefore, in CPP sensor design, the shields/leads contact the top and bottom of the sensor.

The ever increasing demand for data storage density and data rate have increasingly pushed the limits of data storage designs. Recently in efforts to overcome such limits, engineers and scientists have focused on the use of perpendicular recording. In a perpendicular recording system a write pole emits a highly concentrated magnetic field that is directed perpendicular to the surface of the medium (eg. the disk). This field in turn magnetizes a localized portion of the disk in a direction perpendicular to the surface of the disk, thereby creating a bit of data. The resulting flux travels through the disk to a return path having a much larger area than the area in which the bit was recorded. The increased interest in perpendicular recording has lead to an increased interest in current perpendicular to plane (CPP) sensors, which are particularly suited to use in perpendicular recording.

The development of perpendicular recording systems have presented several challenges. For example, as discussed above, when using a GMR or AMR sensor, the sensor must be disposed between a pair of magnetic shields in order to avoid reading stray fields and to define the bit length (gap height). However, in a perpendicular recording system, due to the bi-layer nature of the recording medium the use of shields can actually erase data from the disk. Because the disk in a perpendicular recording system has a magnetically soft under-layer, the shields tend to act sort of as magnetic antennas that concentrate stray longitudinal and transverse magnetic fields that can inadvertently erase data from the disk.

Another challenge associated with perpendicular recording is the nature of the signal read from the disk. In a longitudinal system, the signal read resembles a bell curve, and the algorithms currently in use are adapted to read such bell curves. In a perpendicular recording system however, the signal is bi-polar in that it resembles a sine wave that passes from positive to negative for a single bit of data. This presents challenges for read channel designers in that new algorithms must be developed to read the new signal curve.

With the ever increasing need for increased data density and data rate, a strong need exists for decreasing bit lengths in order to fit more bits of data onto a given length of data track. As those skilled in the art will recognize, the bit length when using a GMR or AMR sensor is limited to the distance between the shields. One way to greatly decrease the bit length is to use a differential sensor. A differential sensor essentially comprises a pair of GMR sensors, the free layer of each sensor being separated by a spacer layer. The spacer layer can be constructed of a non-magnetic material such as Cu and need only be thick enough to prevent magnetic coupling of the two free layers. The pinned layers are then located opposite one another at opposite sides of the dual GMR structure. The pinned layers each have a reference layer, which is the portion of the pinned layer closest to its respective free layer and is the portion of the pinned layer that determines the GMR effect. In such a differential structure, the reference layers of the GMRs are out of phase with one another. That is to say they have magnetic moments that are pinned 180 degrees with respect to on another. In this way, when the free layers of each GMR are detecting the same magnetic field (eg. magnetic field oriented in the same direction) the signals from each GMR cancel out. However, when one free layer is detecting a field in one direction, and the other free layer detects a field in the opposite direction, the signals from each GMR are additive. In this way the differential GMR can read a magnetic transition on a magnetic medium. When the differential GMR passes over such a transition, it will register a resistance change when each free layer is on an opposite side of the transition.

The effective read gap (ie. bit length) when using a differential GMR sensor is the distance between the first and second free layers, a distance which can be exceedingly small. In fact the read gap of a differential sensor can be a small fraction of that which is possible using a standard GMR sensor. Another advantage of using a differential GMR sensor is that no shields are needed. This eliminates the above discussed problem of disk erasure. Such a differential sensor also has the advantage that it reads a magnetic transition in a perpendicular recording system as a bell curve rather than a bipolar sine wage, thereby avoiding the need to create new channel algorithms as discussed above.

One problem that exists with prior art differential sensors is that stray longitudinal fields from adjacent tracks can be read by the sensor, thereby generating unacceptable noise in the signal. This problem becomes more acute as track density increases.

Therefore, there remains a need for a practical differential GMR sensor design that can reduce or eliminate noise produced by stray longitudinal fields such as from adjacent tracks. Such a design would preferably provide enhanced GMR signal, since such performance enhancements are needed to meet ever increasing data rate and data density requirements. Such a design would also preferably be usable as a CPP sensor useful in perpendicular recording systems and could eliminate the need for magnetic shields.

SUMMARY OF THE INVENTION

The present invention provides a current perpendicular to plane (CPP) giant magnetoresistive (GMR) sensor. The sensor includes an in stack bias layer structure that is used to bias the magnetic moment of first and second free layers disposed at either side thereof. The bias structure includes an antiferromagnetic layer (AFM). An odd number of antiparallel (AP) coupled magnetic layers are formed on a first side of the AFM and an even number of AP coupled magnetic layers on the opposite side of the AFM. The antiparallel coupled magnetic layers on either side of the AFM have their magnetic moments pinned by exchange coupling with the AFM layer. The outermost magnetic layer on the first side has its magnetic moment pinned in a first direction, and the outermost magnetic layer on the second side has its magnetic moment pinned in a second direction that is antiparallel with the first direction.

The first free layer is separated from the biasing structure by a non-magnetic, electrically conductive coupling layer that of such a thickness to weakly antiparallel couple the adjacent magnetic layer of the biasing structure. In this way, the first free layer is biased, but not pinned, in a direction antiparallel with the outermost magnetic layer closest to the first magnetic layer. Similarly, the second free layer is separated from the biasing structure by a non-magnetic, electrically conductive coupling layer that is of such a thickness to weakly antiparallel couple the second free layer with the outermost magnetic layer closest to the second free layer.

First and second pinned layer structures are separated from the first and second free layers by non-magnetic, electrically conductive spacer layers, such as Cu. The pinned layer structures are located at outer portions of the sensor away from the inner bias structure.

The sensor of the present invention advantageously, provides a differential CPP sensor that can read magnetic transitions without the need for shields. This makes the sensor of the present invention particularly suited for use in perpendicular recording systems.

The sensor of the present invention is advantageously unaffected by stray longitudinal fields as well as stray transverse fields. The first and second pinned layers of the sensor have moments that are pinned antiparallel to one another, which eliminates sensitivity to transverse stray fields. Similarly, the moments of the free layers are antiparallel to one another which makes the sensor insensitive to longitudinal stray fields.

These and other advantages and aspects of the present invention can be better appreciated upon reading of the following detailed description taken in conjunction with the Figures in which like reference numerals designate like elements throughout the various Figures.

BRIEF DESCRIPTION OF THE DRAWINGS

For a fuller understanding of the nature and advantages of this invention, as well as the preferred mode of use, reference should be made to the following detailed description read in conjunction with the accompanying drawings.

BEST MODE FOR CARRYING OUT THE INVENTION

The following description is of the best embodiments presently contemplated for carrying out this invention. This description is made for the purpose of illustrating the general principles of this invention and is not meant to limit the inventive concepts claimed herein.

Figure 1:
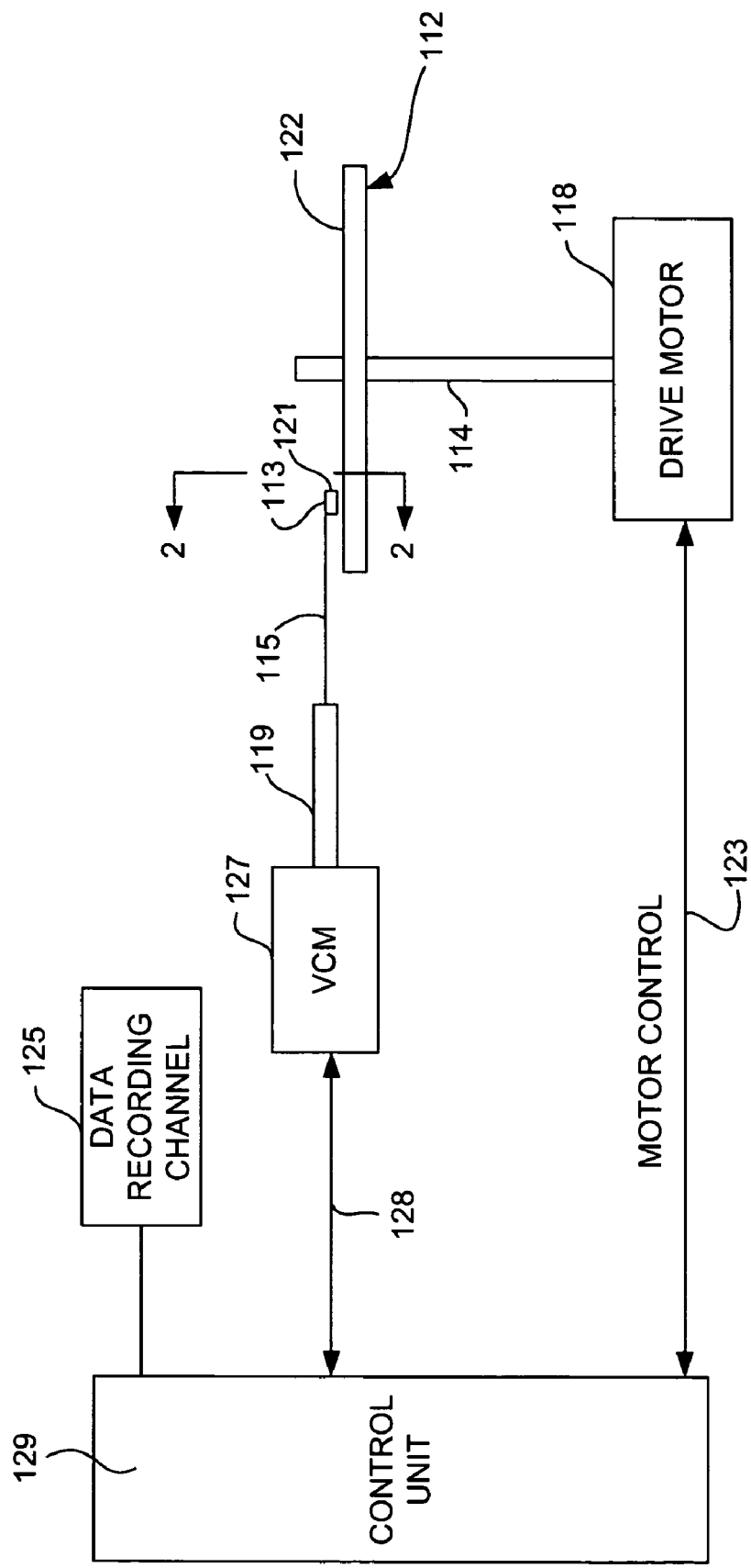
FIG. 1 is a schematic illustration of a disk drive system in which the invention might be embodied.

Referring now to FIG. 1, there is shown a disk drive 100 embodying this invention. As shown in FIG. 1, at least one rotatable magnetic disk 112 is supported on a spindle 114 and rotated by a disk drive motor 118. The magnetic recording on each disk is in the form of annular patterns of concentric data tracks (not shown) on the magnetic disk 112.

At least one slider 113 is positioned near the magnetic disk 112, each slider 113 supporting one or more magnetic head assemblies 121. As the magnetic disk rotates, slider 113 moves radially in and out over the disk surface 122 so that the magnetic head assembly 121 may access different tracks of the magnetic disk where desired data are written. Each slider 113 is attached to an actuator arm 119 by way of a suspension 115. The suspension 115 provides a slight spring force which biases slider 113 against the disk surface 122. Each actuator arm 119 is attached to an actuator means 127. The actuator means 127 as shown in FIG. 1 may be a voice coil motor (VCM). The VCM comprises a coil movable within a fixed magnetic field, the direction and speed of the coil movements being controlled by the motor current signals supplied by controller 129.

During operation of the disk storage system, the rotation of the magnetic disk 112 generates an air bearing between the slider 113 and the disk surface 122 which exerts an upward force or lift on the slider. The air bearing thus counter-balances the slight spring force of suspension 115 and supports slider 113 off and slightly above the disk surface by a small, substantially constant spacing during normal operation.

The various components of the disk storage system are controlled in operation by control signals generated by control unit 129, such as access control signals and internal clock signals. Typically, the control unit 129 comprises logic control circuits, storage means and a microprocessor. The control unit 129 generates control signals to control various system operations such as drive motor control signals on line 123 and head position and seek control signals on line 128. The control signals on line 128 provide the desired current profiles to optimally move and position slider 113 to the desired data track on disk 112. Write and read signals are communicated to and from write and read heads 121 by way of recording channel 125.

Figure 2:
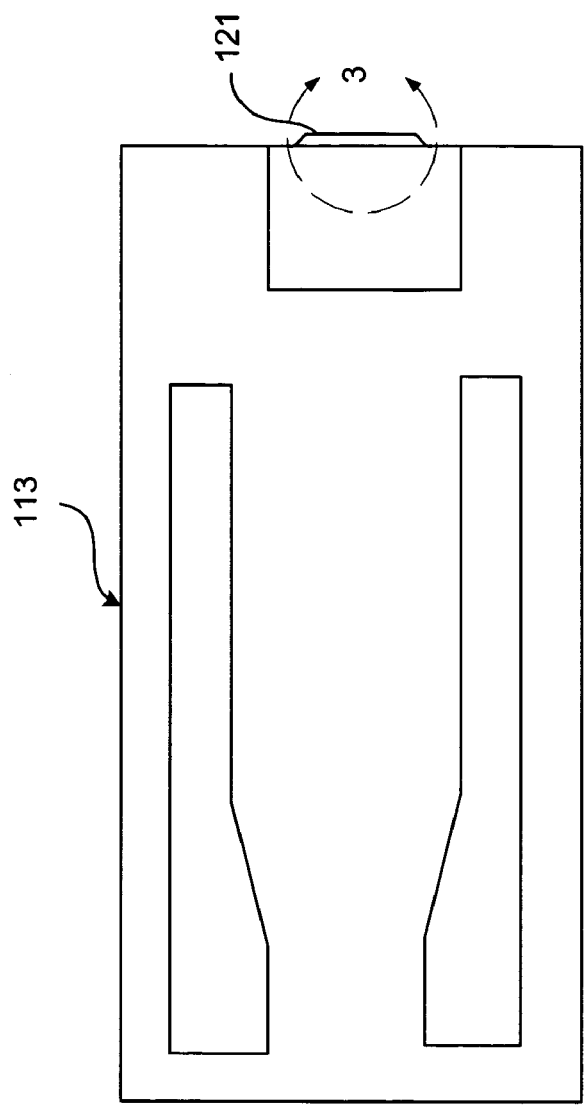
FIG. 2 is an ABS view of a slider illustrating the location of a magnetic head thereon.

With reference to FIG. 2, the orientation of the magnetic head 121 in a slider 113 can be seen in more detail. FIG. 2 is an ABS view of the slider 113, and as can be seen the magnetic head including an inductive write head and a read sensor, is located at a trailing edge of the slider. The above description of a typical magnetic disk storage system, and the accompanying illustration of FIG. 1 are for representation purposes only. It should be apparent that disk storage systems may contain a large number of disks and actuators, and each actuator may support a number of sliders.

Figure 3:
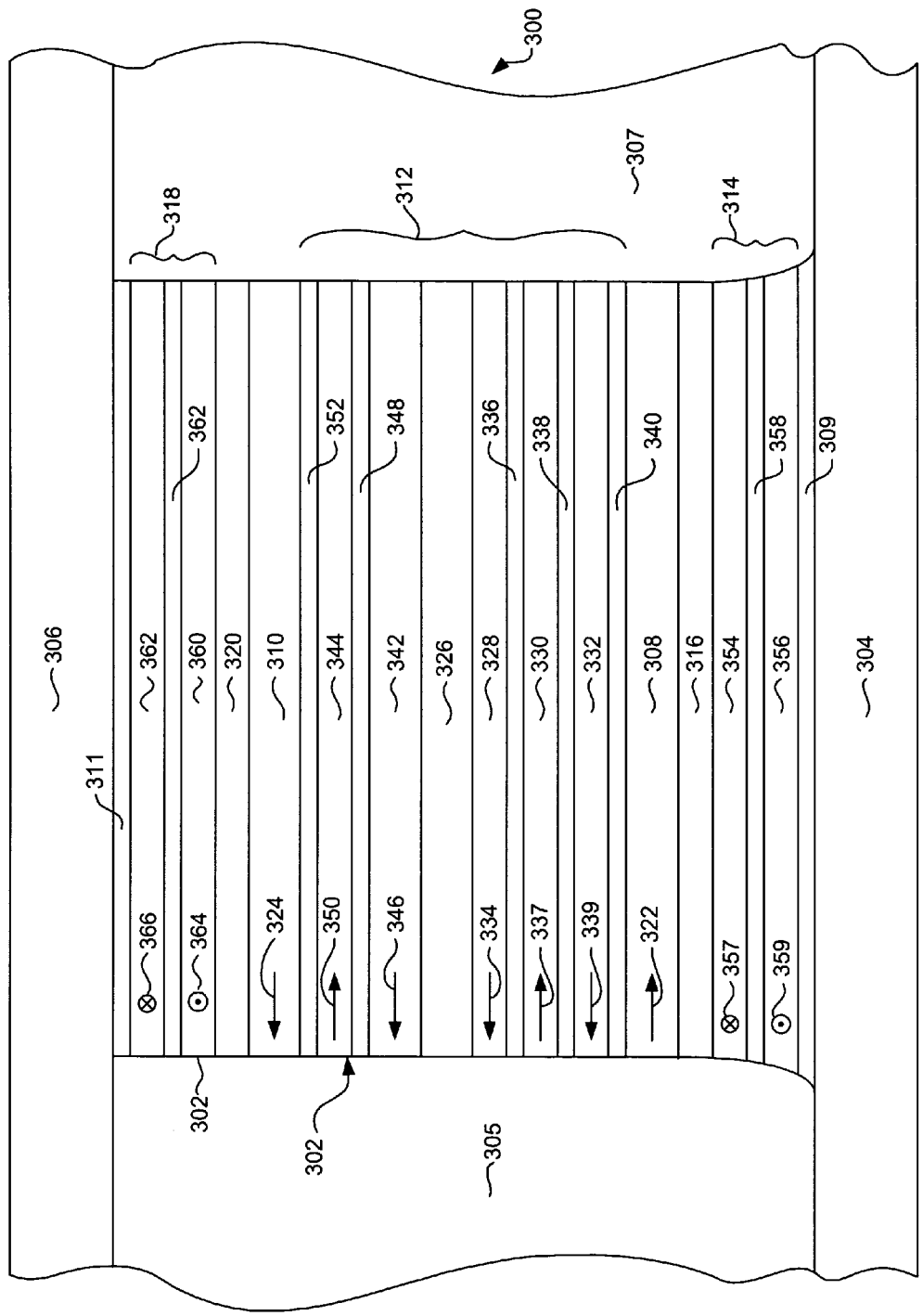
FIG. 3 is an ABS view of a magnetic sensor according to an embodiment of the present invention taken from circle 3 of FIG. 2, shown enlarged and rotated 90 degrees counter-clockwise.

With reference now to FIG. 3, the magnetic head 121 (FIG. 2) includes current perpendicular to plane (CPP) differential giant magnetoresistive (differential GMR) sensor 300. The sensor 300 includes a sensor stack 302 sandwiched between first and second non-magnetic, electrically conductive leads 304, 306. The sensor 300 does not require magnetic shields. First and second insulation layers 305, 307 are provided at first and second lateral sides of the sensor stack 302 to prevent shunting of electrical sense current from one lead 304, to the other 306.

The sensor stack 302 includes first and second magnetic free layers 308, 310 separated by an in stack bias structure 312 that is sandwiched between the first and second free layers 308, 310. The free layers can be constructed of several suitable magnetic materials, and are preferably each constructed of a layer of CoFe and a layer of NiFe with the NiFe layer being located closer to the bias structure. Each of the free layers is preferably 15 to 30 Angstroms thick. The sensor 300 may also include a seed layer 309 at the bottom of the sensor stack 302 that is advantageous for promoting a desired crystalline growth of the subsequently deposited layers. In addition, the sensor 300 may include a capping layer 311 such as Ta at the top of the sensor stack 302 to protect the sensor 300 from corrosion during manufacture.

A first pinned layer structure 314 is located at an outer portion of the sensor stack 302, and is separated from the first free layer 308 by a first spacer layer 316. Similarly, a second pinned layer structure 318 is disposed at an outer portion of the sensor stack 302 opposite the first pinned layer structure 314 and is separated from the second free layer 310 by a second spacer layer 320.

With continued reference to FIG. 3, the first free layer has a magnetic moment that is biased in a first direction parallel to the air bearing surface ABS as indicated by arrow 322. The second free layer has a magnetic moment that is biased in a second direction that is antiparallel (opposite) the first direction (ie. antiparallel to the moment 322 of the first free layer 308) as indicated by arrow 324.

The magnetic moments 322, 324 of the first and second free layers are biased by the bias structure 312. The bias structure includes a layer of antiferromagnetic material (AFM layer) 326. An odd number (preferably three) of antiparallel coupled ferromagnetic layers are disposed on one side of the AFM layer 326 and an even number of AP coupled ferromagnetic layers (preferably two) is disposed on the opposite of the AFM layer 326. For purposes of illustration then first, second and third magnetic layers 328, 330, 332 are disposed on a first side of the AFM layer 326. The first magnetic layer 328 is exchange coupled with the AFM layer, which strongly pins its magnetic moment 334 in the second direction, antiparallel with the direction of the moment 322 of the first magnetic layer 308. The second magnetic layer 330 is separated from the first magnetic layer 328 by an AP coupling layer 336. The first AP coupling layer 336, which can be Ru or some other material, is constructed of a thickness to strongly antiparallel couple the first and second ferromagnetic layers 328, 330. The second magnetic layer 330, therefore, has a magnetic moment 337 that is pinned in the first direction parallel with the moment 322 of the first free layer 308. The thickness of the first AP coupling layer can, therefore, be 2 to 8 or about 4 Angstroms. The third ferromagnetic layer 332 is separated from and AP coupled to the second ferromagnetic layer 330 by a second AP coupling layer 338, which can also be constructed of Ru or some other material and is constructed of a thickness to strongly antiparallel couple second and third magnetic layers 330, 332. The thickness of the second AP coupling layer 338 can, therefore, be 2 to 8 Angstroms or about 4 Angstroms. The third magnetic layer 332, therefore, has a magnetic moment 339 that is strongly pinned in the second direction.

The first second and third magnetic layers can be constructed of many magnetic materials. The first magnetic layer 328 is preferably constructed of $CoFe_{30}$, whereas the second and third magnetic layers 330, 332 are preferably constructed of NiFe. The first and third magnetic layers 228, 332 preferably have magnetic thicknesses that when summed together equal the magnetic thickness of the second magnetic layer 330. Magnetic thickness will be understood by those skilled in the art to be the physical thickness of a material multiplied by the magnetic moment. The first and third magnetic layers preferably have a physical thickness of 5 to 15 Angstroms or about 10 Angstroms. The second magnetic layer preferably has a physical thickness of 15 to 25 Angstroms or about 20 Angstroms.

With continued reference to FIG. 3, the free layer is separated from the third magnetic layer 332 of the bias structure 312 by a bias coupling layer 340. Similar to the AP coupling layers, the bias coupling layer 340 can be constructed of several non-magnetic, electrically conductive materials such as Ru, however the bias coupling layer is constructed of such a thickness as to weakly AP couple the free layer 308 with the third magnetic layer 332. Those skilled in the art will appreciate that this means that the first bias coupling layer 340 should be thicker than the previously discussed AP coupling layers 336, 338. To this end, the bias coupling layer can be 15 to 30 Angstroms or about 18 Angstroms thick. The week AP coupling of the first free layer 308 with the third magnetic layer 332 causes the magnetic moment 322 of the free layer 332 to be biased in the desired first direction while being able to rotate in response to a magnetic field.

With reference still to FIG. 3, the bias structure 312 further includes fourth and fifth magnetic layers 342, 344 disposed at a second side of the AFM layer 326 opposite the first second and third magnetic layers 328, 330. The fourth magnetic layer, preferably constructed of $CoFe_{30}$ is exchange coupled with the AFM layer 326 to strongly pin its magnetic moment 346 in the second direction parallel with the moment 334 of the first magnetic layer 328 and parallel with the moment 324 of the second free layer 310. The fifth magnetic layer 310 is separated from the fourth magnetic layer 342 by a third AP coupling layer 348, which can be for example Ru and is of such a thickness as to strongly AP couple the fourth and fifth magnetic layers 342, 344. This causes the fifth magnetic layer to have a magnetic moment 350 that is oriented in the first direction. The fifth magnetic layer 344 preferably has a magnetic thickness that is substantially equal to the magnetic thickness of the fourth magnetic layer 342. The fifth magnetic layer is preferably constructed of NiFe and is preferably 5 to 15 Angstroms or about 10 Angstroms thick.

The second free layer 310 is separated from the fifth magnetic layer 344 by a second bias coupling layer 352. The second bias coupling layer 352, which can be Ru, is constructed of such a thickness as to weakly AP couple the second free layer 310 with the fifth magnetic layer 344, thereby biasing the magnetic moment 324 in the desired second direction while allowing the moment 324 of the second free layer 310 to rotate in response to a magnetic field.

With continued reference to FIG. 3, the pinned layer structures 314, 318 can be constructed as a simple pinned layer or more preferably can be constructed as an antiparallel AP pinned structure. Also, the pinned layer structures 314, 318 can be self pinned or AFM pinned, and are preferably self pinned.

The first pinned layer 314 preferably includes a first reference layer 354 and a keeper layer 356 that is separated from the reference layer 354 by a fourth AP coupling layer 358 that can be, for example Ru, and is of such a thickness to strongly AP couple the first reference layer 354 and the first keeper layer 356. The fourth AP coupling layer 354 can be for example 2 to 8 Angstroms thick or about 4 Angstroms thick. The first reference layer 354 and the first keeper layer 356 are both preferably constructed of CoFe which has a strong positive magnetostriction. The strong positive magnetostriction in combination with compressive forces within the sensor 300 generate a strong anisotropy, strongly pins the magnetic moments 357, 359 of the reference layer 354 and the keeper layer 356 respectively in directions perpendicular to the ABS.

The second pinned layer 318, includes a second reference layer 360 and a second keeper layer 361, which are separated from one another by a fifth AP coupling layer 362. The AP coupling layer 362 can be constructed of a material such as Ru and can be 2 to 8 Angstroms or about 4 Angstroms thick. The AP coupling layer 362 strongly AP couples the second reference layer 360 with the second keeper layer 361. As with the first pinned layer structure 318, the reference and keeper layers 360, 361 of the second pinned layer are preferably constructed of CoFe which has a strong positive magnetostriction to pin the magnetic moments 364, 366 of reference and keeper layers 360, 361.

With reference to FIG. 3, it can be seen that the moment 364 of the second reference layer 360 is antiparallel with the moment 357 of the first reference layer. During operation of the sensor 300, when the sensor 300 is in the presence of a positive or negative magnetic field, the moments 322, 324 of the first and second free layers will rotate in the same direction into or out of the ABS. It will be appreciated that the GMR signals from each of the first and second free layers 308, 310 will cancel one another resulting in no resistance change for the sensor. However, when the sensor is in the presence of a magnetic transition, such that the moments 322, 324 of each of the free layers 308, 310 move in opposite directions, the signals will be additive.

It should also be pointed out that since the magnetic moments 357, 364 of the first and second reference layers 354, 360 are antiparallel, the effects of stray transverse fields will cancel out so that the sensor 300 is insensitive to such stray transverse fields. Similarly, since the moments 322, 324 of the free layers 308, 310 are antiparallel to one another, the effects of any stray longitudinal fields are cancelled out, rendering the sensor 300 insensitive to random stray longitudinal fields.

Figure 4:
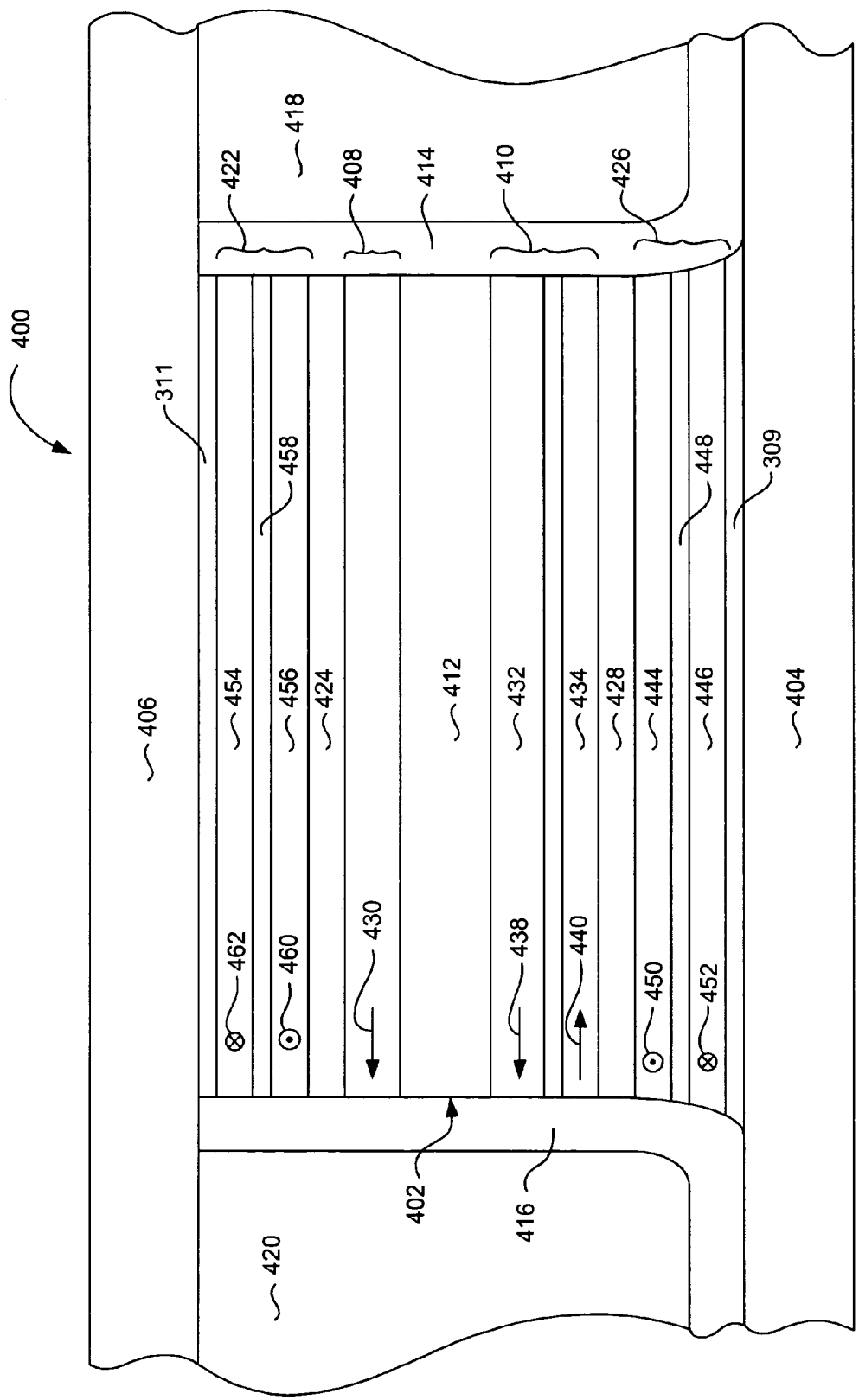
FIG. 4 is an ABS view similar to that of FIG. 3, illustrating an alternate embodiment of the invention.

With reference now to FIG. 4, CPP differential GMR 400 according to another embodiment of the invention includes first a sensor stack 402 sandwiched between first and second electrically conductive non-magnetic leads 404, 406. The sensor stack includes a first and second magnetic free layers 408, 410 separated from one another by a non-magnetic electrically conductive spacer layer 412 which can be for example Cu. The spacer layer 412 is sufficiently thick to avoid exchange coupling the first and second free layers 408, 410.

First and second insulation layers 414, 416 are provide at either lateral side of the sensor stack 402 in order to avoid shunting current between the shields 404, 406 and first and second hard bias layers 418, 420, constructed of a magnetically hard material such as CoPtCr are provided at either lateral side, extending laterally outward from the insulation layers 414, 416.

The sensor 400 further includes a first pinned layer structure 422, which is separated from the first free layer by a first second spacer layer 424, which can be for example Cu. Similarly, the sensor includes a second pinned layer structure 426, which is separated from the second free layer 410 by a third spacer layer, 428, which can also be Cu.

The first free layer 408 can be constructed as a magnetic layer that can include one or more magnetic materials such as Co, CoFe or NiFe. The free layer 408 has a magnetic moment that is oriented in a first direction parallel with the air bearing surface ABS as indicated by arrow 430. The moment 430 of the first free layer 408 is biased by exchange coupling with the first and second bias layers 418, 420 but is free to rotate in response to a magnetic field.

The second free layer 410 is a synthetic free layer, in that it consists of first and second magnetic layers 432, 434 that are AP couple across a first AP coupling layer 436. The first magnetic layer 432 is constructed thicker than the second magnetic layer 434. The first magnetic layer 432 is also located closer to the first spacer layer 412, (ie. further from the second pinned layer structure 414) than the second magnetic layer 434. It will be appreciated that since the since the first and second magnetic layers 432, 434 are AP coupled and have different thicknesses, the net moment of the second free layer 410 will be the difference between the thicknesses of the two layers 432, 434. Since the first magnetic layer 432 is thicker than the second 434, the first magnetic layer 432 will determine the direction of the magnetic moments of both of the layers 432, 434. The exchange coupling with the hard bias layers 418, 420 causes the first magnetic layer 432 to have a moment 438 that is biased in the first direction parallel with the moment 430 of the first free layer 408. The second magnetic layer 434, will however have a magnetic moment 440 that is biased in a second direction antiparallel to the moment 438 of the first magnetic layer 432. Since the second layer 434 is adjacent to the spacer layer 428, it is the layer that affects GMR. The first magnetic layer 432, which does not contribute to GMR, but merely dictates bias direction, can be constructed of many soft magnetic materials such as for example NiFe. The second magnetic layer 434 preferably comprises a material that includes Co, such as pure Co or CoFe, since these materials contribute more readily to GMR performance when located adjacent to the spacer.

With continued reference to FIG. 4, the pinned layers 422, 426 can be either simple or AP pinned and can be self pinned or AFM pinned. Preferably the pinned layers 422, 426 are self pinned, AP pinned structures. The first pinned structure 426 includes a reference layer 444 located adjacent the spacer layer 428 and a keeper layer 446 that is AP coupled with the reference layer across a second AP coupling layer 448. The reference layer has a magnetic moment 450 oriented perpendicular to the ABS and the keeper layer 446 has a moment 452 that is antiparallel to the moment 450.

Similarly, the second pinned layer has a reference layer 454 located adjacent to the spacer layer 424 and has a keeper layer 456 that is antiparallel coupled with the reference layer 454 across a third AP coupling layer 448. The reference layer 456 has a moment 460 that is oriented in the same direction as the moment 450 of the reference layer 444 of the first pinned structure 426. The keeper layer 454 has a moment 462 that is antiparallel to the moment 460 of the reference layer 456.

The sensor 400 may also include a seed layer 463 located at the bottom of the sensor stack 402 to promote a desired crystalline growth in the subsequently deposited layers. The sensor 400 may also include a cap 465 such as Ta located at the top of the sensor stack 402 to protect the sensor 400 from damage during manufacture.

It should be appreciated that the gap height (bit length) for this differential sensor is the distance between the first free layer 408 and the second magnetic layer 434 of the second free layer 410. The sensor 400 reads magnetic transitions when the first free layer 408 is in the presence of a magnetic field that is opposite to a magnetic field acting on the second free layer 410. Since the first magnetic layer 432 is thicker than the second magnetic layer 434, the moment 438 of the first layer 432 will move into the direction of the field to which it is exposed, causing the moment 440 of the second layer to move in an opposite direction. In this way, the sensor 400 can function as a differential sensor (providing additive GMR effect when the free layers 408, 410 experience a difference of field) even though the reference layers 444, 456 have moments 450 460 oriented in the same direction.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

What is claimed is:

1. A current perpendicular to plane (CPP) differential giant magnetoresistive (GMR) sensor, comprising:
    an in stack bias structure;
    a first magnetic free layer located on a first side of the in stack bias structure and having a magnetic moment biased in a first direction;
    a second magnetic free layer located at a second side of said in stack bias structure and having a magnetic moment biased in a second direction antiparallel with the first direction;
    a first pinned layer structure separated from the first free layer by a first spacer layer, the first pinned layer structure having a first reference layer disposed adjacent to the first spacer layer having a magnetic moment pinned in a third direction perpendicular to the first and second directions; and
    a second pinned magnetic layer separated from second free layer by a second spacer layer, the second pinned layer structure having a second reference layer formed adjacent to the second spacer layer having a magnetic moment pinned in a fourth direction perpendicular to the first and second directions and antiparallel to the third direction;
    the in stack bias structure further comprising:
        a layer of antiferromagnetic material;
        first, second and third ferromagnetic layers formed at a first side of the antiferromagnetic material layer, the first ferromagnetic layer being exchange coupled with the AFM layer, the second ferromagnetic layer being separated from and antiparallel coupled with the first ferromagnetic layer by a first AP coupling layer, the third magnetic layer being separated from and antiparallel coupled with the second ferromagnetic layer by a second AP coupling layer;
        fourth and fifth ferromagnetic layers formed at a second side of the antiferromagnetic material layer the fourth ferromagnetic layer being exchange coupled with the AFM layer and the fifth ferromagnetic layer being separated from and antiparallel coupled with the fourth ferromagnetic layer by a third antiparallel coupling layer;

a first bias coupling layer separating the first free layer from the third ferromagnetic layer, the first bias coupling layer being of such a thickness as to weakly antiparallel couple the magnetic moments of the first free layer and the third ferromagnetic layer without pinning the magnetic moment of the first free layer; and a second bias coupling layer separating the fifth magnetic layer from the second free layer, the second bias coupling layer being of such a thickness as to weakly antiparallel couple the magnetic moments of the fifth magnetic layer and the second free layer without pinning the magnetic moment of the second free layer.

2. The sensor as in claim 1, wherein the first and second bias coupling layers each have a thickness of 15 to 30 Angstroms.

3. The sensor as in claim 1, wherein the first and second bias coupling layers are each constructed of Ru having a thickness of 15 to 30 Angstroms.

4. The sensor as in claim 1, further comprising:
a first electrically conducting, non-magnetic lead formed below the first pinned layer; and
a second electrically conducting, non-magnetic lead formed above the second pinned layer.

5. The sensor as in claim 1 wherein the first and fourth magnetic layers each comprise CoFe.

6. The sensor as in claim 1, wherein the first and fourth magnetic layers each comprise $CoFe_{30}$.

7. The sensor as in claim 1, wherein the second, third and fifth magnetic layers comprise NiFe.

8. The sensor as in claim 1, wherein the first and third magnetic layers have magnetic thicknesses that when summed together equal a magnetic thickness of the second magnetic layer, and wherein the fourth magnetic layer has a magnetic thickness that is substantially equal to a magnetic thickness of the fifth magnetic layer.

9. The sensor as in claim 1, wherein the first, third, fourth and fifth magnetic layers each have a thickness of 5 to 15 Angstroms, and the second magnetic layer has a thickness of 15 to 25 Angstroms.

10. The sensor as in claim 1, wherein the first, third, fourth and fifth magnetic layers each have a thickness of about 10 Angstroms, and the second magnetic layer has a thickness of about 20 Angstroms.

11. The sensor as in claim 1, wherein the first second and third AP coupling layers each have a thickness of 2 to 8 Angstroms and the first and second bias coupling layers each have a thickness of 14 to 24 Angstroms.

12. The sensor as in claim 1, wherein the first second and third AP coupling layers comprise Ru and each have a thickness of 2 to 8 Angstroms, and wherein the first and second bias coupling layers comprise Ru and each have a thickness of 14 to 24 Angstroms.

13. The sensor as in claim 1, wherein the first, second and third AP coupling layers comprise Ru and each have a thickness of about 4 Angstroms, and wherein the first and second bias coupling layers comprise Ru and each have a thickness of about 18 Angstroms.

14. The sensor as in claim 1, wherein the AFM layer comprises IrMnCr and has a thickness of 50 to 75 Angstroms.

15. The sensor as in claim 1, wherein the first and second spacer layers each comprise Cu and each have a thickness of 15 to 25 Angstroms.

16. The sensor as in claim 1, wherein the first and second free layers each comprise CoFe and NiFe.

17. The sensor as in claim 1, further comprising:
a first non-magnetic, electrically conductive lead formed full film at a top of the sensor; and
a second non-magnetic, electrically conductive lead formed at a bottom of the sensor.

18. The sensor as in claim 1, further comprising first and second non-magnetic, electrically conductive leads formed at top and bottom surfaces of the sensor and wherein the sensor does not include a magnetic shield.

19. A current perpendicular to plane (CPP) differential giant magnetoresistive (GMR) sensor having an air bearing surface (ABS), the sensor comprising:
an in stack bias structure;
a first magnetic free layer located on a first side of the in stack bias structure and having a magnetic moment biased in a first direction parallel with the ABS;
a second magnetic free layer located at a second side of the in stack bias structure and having a magnetic moment biased in a second direction parallel with the ABS and antiparallel with the first direction;
a first pinned layer structure separated from the first free layer by a first spacer layer, the first pinned layer structure having a first reference layer disposed adjacent to the first spacer layer, the first reference layer having a magnetic moment pinned in a third direction perpendicular to the first and second directions; and
a second pinned magnetic layer separated from second free layer by a second spacer layer, the second pinned layer structure having a second reference layer formed adjacent to the second spacer layer, the second reference layer having a magnetic moment pinned in a fourth direction perpendicular to the first and second directions and antiparallel to the third direction; the biasing structure further comprising:
a layer of antiferromagnetic (AFM) material;
an odd number of antiparallel coupled magnetic layers formed at a first side of the AFM material layer, at least one of the layers being exchange coupled with the AFM layer, each of the layers being antiparallel coupled with one another;
an even number of antiparallel coupled magnetic layers formed at a second side of the AFM material layer, at least one of the layers being exchange coupled with the AFM layer, each of the layers being antiparallel coupled with one another;
a first non-magnetic, electrically conductive bias coupling layer formed between the first free layer and the bias structure, the first coupling layer being of such a thickness as to bias, but not pin the magnetic moment of the first free layer antiparallel to the a nearest one of the odd number of antiparallel coupled magnetic layers of the bias structure; and
a second non-magnetic, electrically conductive bias coupling layer formed between the second free layer and the bias structure, the second coupling layer being of such a thickness to bias, but not pin the magnetic moment of the second free layer antiparallel to a nearest one of the even number of antiparallel coupled magnetic layers of the bias structure.

20. The sensor as in claim 19 wherein the first and second pinned layers are antiparallel (AP) pinned structures.

21. The sensor as in claim 19, wherein the first and second pinned layers are antiparallel (AP) pinned and are self pinned without exchange coupling to an antiferromagnetic AFM layer.

22. The sensor as in claim 19 wherein the AFM layer comprises IrMnCr.

23. The sensor as in claim 19, wherein the first and second free layers each have a thickness of 15 to 30 Angstroms.

24. A magnetic data storage system, comprising:
a magnetic medium
a slider;
an actuator coupled with the slider for moving the slider adjacent to the magnetic medium; and
a current perpendicular to plane (CPP) differential giant magnetoresistive (GMR) sensor connected with the slider and having an air bearing surface (ABS), the sensor comprising:
an in stack bias structure;
a first magnetic free layer located on a first side of the in stack bias structure and having a magnetic moment biased in a first direction parallel with the ABS;
a second magnetic free layer located at a second side of the in stack bias structure and having a magnetic moment biased in a second direction parallel with the ABS and antiparallel with the first direction;
a first pinned layer structure separated from the first free layer by a first spacer layer, the first pinned layer structure having a first reference layer disposed adjacent to the spacer layer, the first reference layer having a magnetic moment pinned in a third direction perpendicular to the first and second directions; and
a second pinned magnetic layer separated from second free layer by a second spacer layer, the second pinned layer structure having a second reference layer formed adjacent to the second spacer layer, the second reference layer having a magnetic moment pinned in a fourth direction perpendicular to the first and second directions and antiparallel to the third direction; the biasing structure further comprising:
a layer of antiferromagnetic (AFM) material;
an odd number of antiparallel coupled magnetic layers formed at a first side of the AFM material layer, at least one of the layers being exchange coupled with the AFM layer, each of the layers being antiparallel coupled with one another;
an even number of antiparallel coupled magnetic layers formed at a second side of the AFM material layer, at least one of the layers being exchange coupled with the AFM layer, each of the layers being antiparallel coupled with one another;
a first non-magnetic, electrically conductive bias coupling layer formed between the first free layer and the bias structure, the first coupling layer being of such a thickness as to bias, but not pin the magnetic moment of the first free layer antiparallel to a a nearest one of the odd number of antiparallel coupled magnetic layers of the bias structure; and
a second non-magnetic, electrically conductive bias coupling layer formed between the second free layer and the bias structure, the second coupling layer being of such a thickness to bias, but not pin the magnetic moment of the second free layer antiparallel to a nearest one of the odd number of antiparallel coupled magnetic layers of the bias structure.

25. A current perpendicular to plane (CPP) differential giant magnetoresistive (GMR) sensor, comprising:
a first magnetic free layer structure having a magnetic moment biased in a first direction;
a second magnetic free layer structure;
a first non-magnetic, electrically conductive spacer layer separating the first and second free layers, and being of sufficient thickness to avoid exchange coupling of the first and second free layers,
a second non-magnetic, electrically conductive spacer layer formed adjacent the first magnetic free layer structure, opposite the first spacer layer;
a third non-magnetic, electrically conductive spacer layer formed adjacent the second free layer structure, opposite the first spacer layer;
a first magnetic pinned layer structure, the first pinned layer structure having a first reference layer disposed adjacent the second spacer layer opposite the first magnetic free layer structure; and
a second pinned layer structure, the second pinned layer structure having a second reference layer disposed adjacent the third spacer layer, opposite the second free layer structure;
the second free layer structure comprising:
a first magnetic layer;
a second magnetic layer; and
a non-magnetic, electrically conductive coupling layer separating, and antiparallel coupling the first and second magnetic layers;
the first magnetic layer being disposed adjacent the first spacer layer and having a magnetic thickness greater than a thickness of the second magnetic layer, the first magnetic layer having a magnetic moment biased in the first direction parallel to the magnetic moment of the first free layer, the second magnetic layer having a magnetic moment oriented antiparallel to the magnetic moment of the first magnetic layer.

26. The sensor as in claim 25, further comprising first and second non-magnetic, electrically conductive leads formed full film across opposite top and bottom surfaces of the sensor.

27. The sensor as in claim 26, further comprising first and second insulating layers formed at first and second laterally disposed side walls of sensor between the first and second leads.

28. The sensor as in claim 27, wherein the first magnetic layer of the second free layer structure comprises a magnetically soft material that does not contribute to giant magnetoresistive effect (GMR).

29. The sensor as in claim 25, wherein the first free layer further comprises:
a third magnetic layer, disposed adjacent to the third spacer layer;
a fourth magnetic layer, constructed of a soft magnetic material, located adjacent to the first spacer layer, the fourth magnetic layer being magnetically thinner than the third magnetic layer; and
a non-magnetic, electrically conductive coupling layer separating and antiparallel coupling the third and fourth magnetic layers.

* * * * *

UNITED STATES PATENT AND TRADEMARK OFFICE
CERTIFICATE OF CORRECTION

PATENT NO. : 7,242,556 B2
APPLICATION NO. : 10/874066
DATED : July 10, 2007
INVENTOR(S) : Hardayal Singh Gill It is certified that error appears in the above-identified patent and that said Letters Patent is hereby corrected as shown below:

In claim 19, column 12, line 56 between "antiparallel to" and "a", please delete "the".

Signed and Sealed this

Eighth Day of June, 2010

David J. Kappos
*Director of the United States Patent and Trademark Office*